United States Patent
Patil et al.

(10) Patent No.: US 9,691,497 B2
(45) Date of Patent: Jun. 27, 2017

(54) PROGRAMMABLE DEVICES WITH CURRENT-FACILITATED MIGRATION AND FABRICATION METHODS

(71) Applicant: GLOBALFOUNDRIES Inc., Grand Cayman (KY)

(72) Inventors: Suraj K. Patil, Ballston Lake, NY (US); Min-hwa Chi, Malta, NY (US); Ajey P. Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/867,331

(22) Filed: Sep. 28, 2015

(65) Prior Publication Data

US 2017/0092373 A1    Mar. 30, 2017

(51) Int. Cl.

| | | |
|---|---|---|
| *G11C 17/16* | (2006.01) | |
| *H01L 23/525* | (2006.01) | |
| *H01L 29/78* | (2006.01) | |
| *H01L 29/06* | (2006.01) | |

(52) U.S. Cl.
CPC .......... *G11C 17/16* (2013.01); *H01L 23/5256* (2013.01); *H01L 29/0673* (2013.01); *H01L 29/785* (2013.01)

(58) Field of Classification Search
CPC ..... H01L 23/5256; H01L 28/24; G11C 17/16; G11C 17/165
See application file for complete search history.

(56) References Cited

U.S. PATENT DOCUMENTS

| | | | |
|---|---|---|---|
| 8,816,327 B2 | 8/2014 | Chang et al. | |
| 8,860,176 B2 * | 10/2014 | Fritz | H01L 23/5252 257/530 |
| 8,981,524 B2 * | 3/2015 | Tajima | H01L 27/101 257/50 |
| 9,263,385 B1 * | 2/2016 | Singh | G11C 17/16 |

(Continued)

OTHER PUBLICATIONS

"Electrically Programmable Fuse (eFuse) Using Electromigration in Silicides", IEEE EDL, vol. 23 No. 9, pp. 523-525, 2002, C. Kothandaraman, et al.

(Continued)

*Primary Examiner* — Allison P Bernstein
(74) *Attorney, Agent, or Firm* — Heslin Rothenberg Farley and Mesiti PC

(57) ABSTRACT

Programmable devices and fabrication methods thereof are presented. The programmable devices include, for instance, a first electrode and a second electrode electrically connected by a link portion. The link portion includes one material of a metal material or a semiconductor material and the first and second electrodes includes the other material of the metal material or the semiconductor material. For example, the link portion facilitates programming the programmable device by applying a programming current between the first electrode and the second electrode to facilitate migration of the one material of the link portion towards at least one of the first or second electrodes. In one embodiment, the programming current is configured to heat the link portion to facilitate the migration of the one material of the link portion towards the at least one of the first or second electrodes.

18 Claims, 3 Drawing Sheets

(56) References Cited

U.S. PATENT DOCUMENTS

2008/0217736 A1* 9/2008 Cestero ............... H01L 23/5252
    257/530
2009/0135640 A1* 5/2009 Kim ....................... G11C 17/16
    365/96

OTHER PUBLICATIONS

"eFuse Design and Reliability", IEEE International Integrated Reliability Workshop, 2008, W.R. Tonti.
"A Novel Via-fuse Technology Featuring Highly Stable Blow Operation with Large On-off Ratio for 32nm Node and Beyond", IEEE, p. 43, 2007, H. Takaoka, et al.

* cited by examiner

PROGRAMMABLE DEVICES WITH CURRENT-FACILITATED MIGRATION AND FABRICATION METHODS

TECHNICAL FIELD

The present invention relates to devices, such as semiconductor devices, and more particularly to programmable devices which may be programmed with current-facilitated migration and related methods.

BACKGROUND OF THE INVENTION

In the fabrication of integrated circuits, one-time programmable (OTP) memories may be used to facilitate programming of certain information on-chip during fabrication processing or subsequently thereafter. So-called e-fuses have been proposed, in which a fuse link is "blown" or open-circuited to achieve programming. For example, a fuse link may be open-circuited by catastrophic electromigration or thermal rupture/melting. In such a case, a single bit may be stored because, for example, an open-circuit may be sensed and interpreted as a digital 0 and a closed-circuit may be sensed and interpreted as a digital 1. Conventional electromigration or thermal rupture based fuse based techniques, however, have several drawbacks that limit their usefulness.

For instance, conventional fuse devices require high voltages for fast programming at higher currents, and are therefore not suitable as semiconductor devices continued to be scaled down in size and voltage in advanced technology nodes, because the required high programming voltages and current may damage such on-chip semiconductor devices. In addition, existing devices are only useful for programming digital information, because an e-fuse is either blown or not, and the catastrophic failure of a fuse link cannot be controlled to allow for partial open-circuiting to facilitate the storage of continuous, non-binary information.

Therefore, a need exists for new programmable devices, such as one-time programmable devices, for analog or digital use, to overcome the limitations of electromigration or thermal rupture-based e-fuses.

BRIEF SUMMARY

The shortcomings of the prior art are overcome, and additional advantages are provided, through the provision, in one aspect, of a programmable device. The programmable device includes: a first electrode and a second electrode electrically connected by a link portion. The link portion includes one material of a metal material or a semiconductor material and the first and second electrodes includes the other material of the metal material or the semiconductor material. For example, the link portion facilitates programming the programmable device by applying a programming current between the first electrode and the second electrode to facilitate migration (e.g., of atoms) of the one material of the link portion towards at least one of the first or second electrodes. For example, the migration triggers a metal semiconductor reaction, e.g., silicide formation.

In another aspect, a method of fabricating a programmable device is presented. The method includes forming a first electrode and a second electrode above a substrate. The method further includes providing a link portion above the substrate and electrically connecting the first electrode and the second electrode, the link portion including one material of a metal material or a semiconductor material and the first and second electrodes including the other material of the metal material or the semiconductor material. The link portion facilitates programming the programmable device by applying a programming current between the first electrode and the second electrode to facilitate migration (e.g., of atoms) of the one material of the link portion towards at least one of the first or second electrodes.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
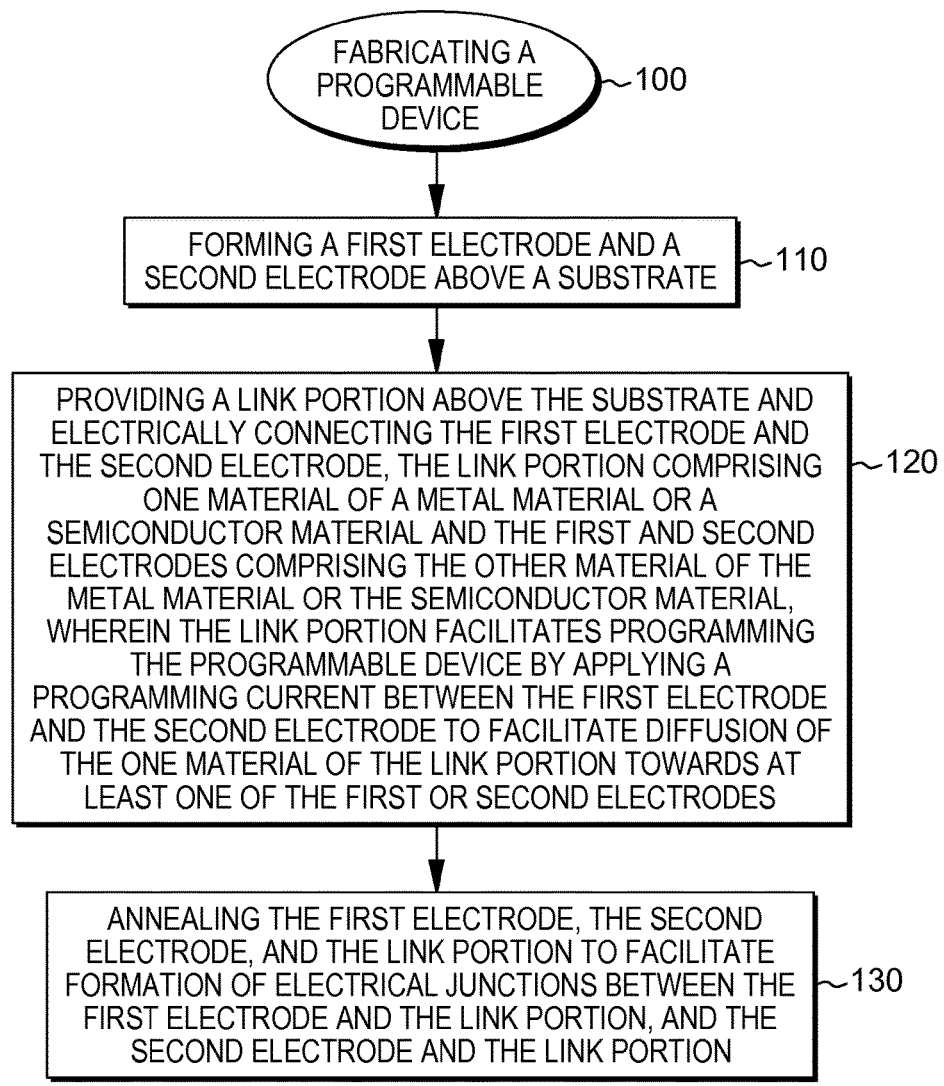
FIG. 1 depicts embodiments of a process for fabricating programmable devices, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, programmable devices and methods for fabricating programmable devices, for example, for use as one-time programmable memories for integrated circuits or chips. In the fabrication of integrated circuits, one-time programmable memories may be used to facilitate programming of certain information on-chip during fabrication processing or subsequently thereafter. So-called e-fuses have been proposed, in which a fuse link is "blown" or open-circuited by catastrophic electromigration or thermal rupture of a fuse link to achieve programming. In such a case, a single bit may be stored because, for example, an open-circuit may be sensed and interpreted as a digital 0 and a closed-circuit may be sensed and interpreted as a digital 1. Existing electromigration or thermal rupture-based fuse based techniques, however, have several drawbacks that limit their usefulness.

For instance, existing fuse devices require high voltages (and current) for programming, and are therefore not suitable as semiconductor devices continued to be scaled down in size in advanced technology nodes, because the required high programming voltages (or current) may damage such on-chip semiconductor devices. In addition, existing devices are only useful for programming digital information, because an e-fuse is either blown or not, and the catastrophic failure of a fuse link cannot be controlled to allow for partial open-circuiting to facilitate the storage of continuous, non-binary information. Therefore, a need exists for new programmable devices to overcome the limitations of electromigration or thermal rupture based e-fuses, such as programmable devices using, e.g., non-catastrophic migration of materials, to allow for controlled programming.

Generally stated, provided herein, in one aspect, is a programmable device. The programmable device includes: a first electrode and a second electrode electrically connected by a link portion. The link portion includes one material of a metal material or a semiconductor material and the first and second electrodes includes the other material of the metal material or the semiconductor material. For example, the link portion facilitates programming the programmable device by applying a programming current between the first electrode and the second electrode to facilitate migration of the one material of the link portion towards at least one of the first or second electrodes.

In one embodiment, the programming current is configured to heat the link portion to facilitate the migration (e.g., atomic migration) of the one material of the link portion towards the at least one of the first or second electrodes. In another embodiment, the programming current facilitates a reaction of the metal material and the semiconductor material to form a semiconductor-metal alloy (e.g., silicidation or silicide formation). In a further embodiment, the programming current facilitates, for example, the amount of silicidation, increasing an electrical resistance of the link portion of the programmable device.

In one implementation, the programming current facilitates open-circuiting the programmable device. In another implementation, the link portion includes at least one nanowire, the at least one nanowire including the one material. In a further implementation, the link portion has a certain thickness, the certain thickness of the link portion being selected to facilitate programming of the programmable device with the programming current.

In one example, the link portion includes the metal material and the first and second electrodes includes the semiconductor material, and the programming current facilitates migration (e.g., atomic migration) of the semiconductor material of the at least one of the first or second electrodes into the metal material of the link portion. In another example, the link portion includes the metal material and the first and second electrodes includes the semiconductor material, and the programming current facilitates migration of the metal material of the link portion into the semiconductor material of the at least one of the first or second electrodes. In a further example, the device further includes an insulating layer, the insulating layer being disposed above or below the link portion, where the insulating layer facilitates preserving the heat of the link portion locally generated by the programming current. In such a case, the insulating layer may inhibit heat transfer to other portions of the structure by the programming current.

Reference is made below to the drawings, which are not drawn to scale for ease of understanding, wherein the same reference numbers used throughout different figures designate the same or similar components.

FIG. 1 depicts embodiments of a process for fabricating programmable devices 100, in accordance with one or more aspects of the present invention. For instance, the method includes forming a first electrode and a second electrode above a substrate 110. The method further includes providing a link portion above the substrate and electrically connecting the first electrode and the second electrode, the link portion including one material of a metal material or a semiconductor material and the first and second electrodes including the other material of the metal material or the semiconductor material 120. In such a case, for example, the link portion facilitates programming the programmable device by applying a programming current between the first electrode and the second electrode to facilitate migration of the one material of the link portion towards at least one of the first or second electrodes.

In one embodiment, the fabricating further includes annealing the first electrode, the second electrode, and the link portion to facilitate formation of electrical junctions between the first electrode and the link portion, and the second electrode and the link portion 130. For example, an annealing temperature of less than 350° C., and below the temperature for triggering silicidation, may be successfully used. In another embodiment, the fabricating further includes providing an insulating layer above or below the link portion, where the insulating layer facilitates heating of the link portion by the programming current.

In one implementation, the insulating layer inhibits heat transferring to other portions of the structure by the programming current. In another implementation, the programming current is configured to heat the link portion to facilitate the migration of the one material of the link portion towards the at least one of the first or second electrodes. In a further implementation, the programming current facilitates a reaction of the metal material and the semiconductor material to form a semiconductor-metal alloy (e.g., silicidation).

In one embodiment, the programming current facilitates increasing an electrical resistance of the link portion of the programmable device. In another embodiment, the programming current facilitates open-circuiting the programmable device. In a further embodiment, the method further includes programming the programmable device, the programming including applying the programming current from the first electrode through the link portion to the second electrode to migrate the one material of the link portion towards the at least one of the first or second electrodes.

Figure 2A:
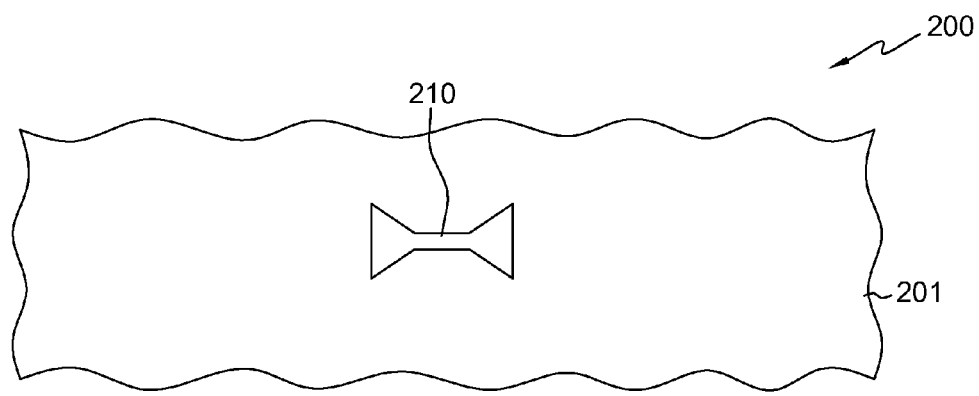
FIG. 2A is a plan view of a structure found in a programmable device fabrication process, in accordance with one or more aspects of the present invention.

FIG. 2A is a plan view of a structure 200 found in a programmable device fabrication process, in accordance with one or more aspects of the present invention. In the embodiment of FIG. 2A, structure 200 includes a link portion 210 disposed above a substrate 201. For example, link portion 210 may be formed using photolithographic techniques.

In one embodiment, link portion 210 may be or include a metal. In another embodiment, link portion 210 may be or include a semiconductor. In one or more examples, link portion 210 may have a narrow nano-wire central portion designed to facilitate programming.

In one or more embodiments, substrate 201 can be a bulk semiconductor material such as a bulk silicon wafer. In another embodiment, substrate 210 can include silicon (Si), single crystal Si, polycrystalline Si, amorphous Si, Si-on-nothing (SON), Si-on-insulator (SOI), or Si-on-replacement insulator (SRI). In a further embodiment, substrate 201 can be n-type or p-type doped. In such a case, substrate 201 may be doped, or various regions may be n-type and p-type doped to form various n-wells and p-wells. In one particular example, substrate 201 can have a thickness of less than or equal to 0.1 micrometers.

Figure 2B:
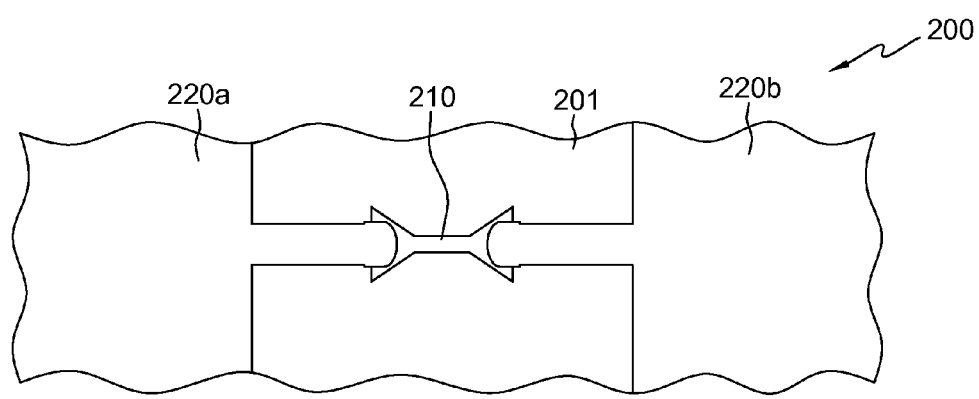
FIG. 2B depicts the structure of FIG. 2A, after forming a first electrode and a second electrode, in accordance with one or more aspects of the present invention.

FIG. 2B depicts structure 200, after forming a first electrode 220a and a second electrode 220b, in accordance with one or more aspects of the present invention. For example, the electrodes may be formed using photolithographic patterning techniques.

In one or more embodiments, electrodes 220a, 220b may be or include a metal, and link portion 210 may be or include a semiconductor material. In other embodiments, electrodes 220a, 220b may be or include a semiconductor material, and link portion 210 may be or include a metal.

In one embodiment, first electrode 220a, second electrode 220b, and link portion 210 may be annealed to help form electrical junctions. For example, electrical junctions between each of electrodes 220a, 220b and the link portion may be formed in such an annealing process (e.g., a temperature <350° C. and below the silicidation temperature). In one case, the entire structure 200 may be annealed, and in another case, only electrodes 220a, 220b and link portion 210 may be annealed (e.g., using laser annealing).

By way of explanation, during operation of a programmable device, a pre-determined programming current may flow between first electrode 220a and second electrode 220b through link portion 210. In such an example, an appropriately tuned current can cause local heating of link portion 210, such as Joule heating due to the passage of the current. In one or more embodiments, heating of link portion 210 by the programming current can lead to precisely controlled migration of material of link portion 210 towards one or both of electrodes 220a, 220b, for example, formation of metal-Si silicided alloy. For example, such material migration and/or silicidation can serve to increase the electrical resistance of the programmable device, therefore programming the device. In one example, such programming is irreversible, as the migrated atoms after silicidation cannot be returned to their initial locations.

In operation of such a programmable device, for example, a specific programming current may be used for a specific duration to increase the resistance of the programmable device by a specific amount. In addition, a relatively large programming current and/or a relatively large programming duration may be used to increase the resistance of the programmable device beyond a certain peak value, which can effectively open-circuit the programmable device.

By way of example, such a programmable device can be used to tune an analog integrated circuit to have a specific resistance for use in conjunction with an analog subsystem, such as a radiofrequency transmitter or receiver. In another example, specific values of the resistance may be set and later sensed to store digital information. In one specific example, a starting resistance of link portion 210 may be sensed as a digital 1, and a peak resistance value of link portion 210 may be sensed as a digital zero. Such "analog programmable device" is possibly formed and operated due to that the mechanism of atom migration and silicidation can be reliably controlled slowly enough by the local temperature from the Joel heating of the programming current.

In one or more embodiments, an array of programmable devices may be fabricated on-chip, along with programming and sensing circuitry, such as sense and set lines, to facilitate programming and reading the programmable devices during run time of the integrated circuit. In another, programmable devices may be precisely programmed a fabrication facility to tune analog circuits such as radiofrequency circuitry to perform within specified tolerances. In one deployment model, programmable devices may be fabricated on-chip, and the chip may be deployed to an assembly factory where the chip and other components are assembled into a finished product, at which time the programmable devices may be programmed in conjunction with other components, such as analog components, to facilitate formation of tuned finished devices incorporating the chip.

In one embodiment, as a programming current flows through link portion 210, a reaction may take place between the metal material and the semiconductor material to form a semiconductor-metal alloy (e.g., silicided alloy). For example, link portion 210 may include silicon and electrodes 220a, 220b may include nickel, and the programming current may facilitate formation of nickel silicide. In addition, such reactions may lead to an increase in the electrical resistance of link portion 210. For example, this could be due to formation of high resistance nickel silicide or nickel di-silicide phase formation.

In another embodiment, migration of link portion 210 during programming may lead to a physical gap between one or more of electrodes 220a, 220b and link portion 210, leading to a physical open-circuit. As described herein, an open-circuit refers to both a physical separation and a situation in which a peak resistance value is reached that, at the operating voltages used in the integrated circuit, is sensed effectively as an open-circuit.

In one or more embodiments, the shape of link portion 210 may be tuned to meet on-chip operating requirements for voltage, programming current, programming time, and the like. For example, link portion 210 may be formed or deposited with a certain thickness so that sufficient migration of material of link portion 210 may take place during a specific interval of a specific programming current.

Figure 2C:
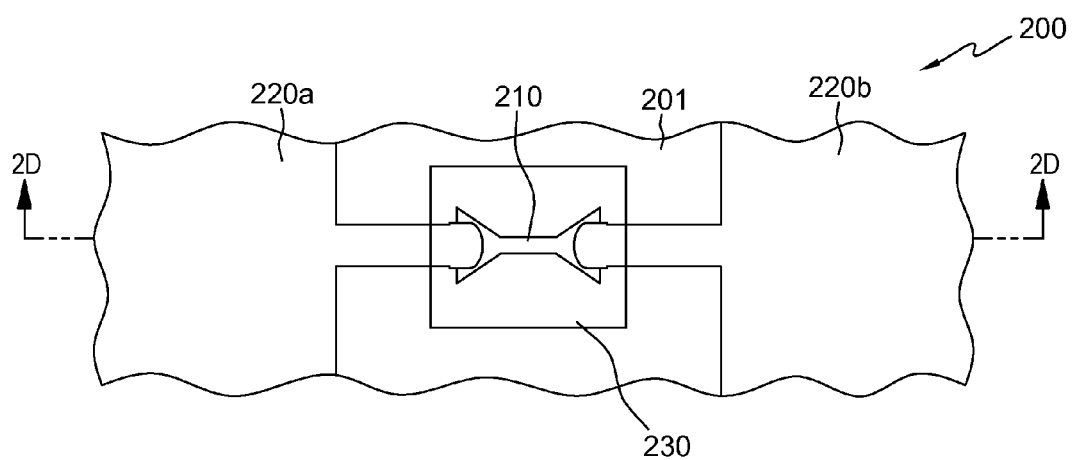
FIG. 2C depicts the structure of FIG. 2B, after providing an insulating portion above a link portion of the programmable device, in accordance with one or more aspects of the present invention.

FIG. 2C depicts structure 200, after providing an insulating portion 230 above link portion 210, in accordance with one or more aspects of the present invention. In the embodiment of FIG. 2C, insulating portion 230 has been provided over link portion 210, and may be used to further control or tune programming of the programmable device. For example, during programming, localized Joule heating of link portion 210 may lead to a certain amount of heat being generated therein, and insulating portion 230 may be used to preserve the amount of heat to reduce variability in programming times and/or currents. In another example, insulating portion 230 may be used to protect other portions of structure 200 from heat generated during programming. In a further example, insulating portion 230 may be used to encompass any metal, silicide particles, stringer defects, and the like, within the structure.

In one embodiment, insulating portion 230 may be provided below link portion 210. In another embodiment, many insulating portions 230 may be provided, including both above and below link portion 210. In a further embodiment, insulating portion 230 may include an insulating layer deposited over the surface of structure 200 including covering electrodes 220a, 220b.

Figure 2D:
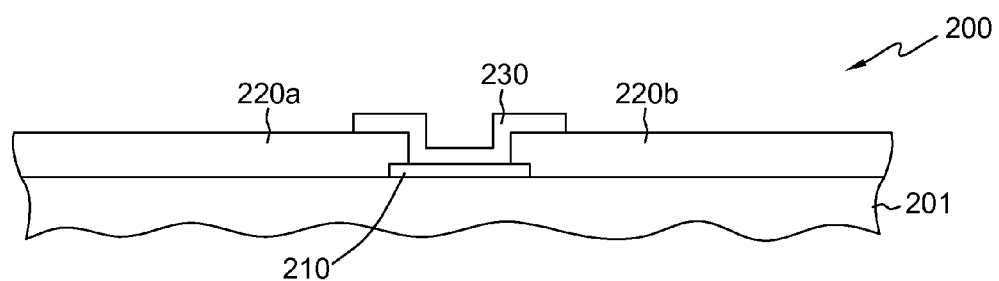
FIG. 2D is a cross-sectional elevational view of the structure of FIG. 2C taken along line 2D-2D thereof, in accordance with one or more aspects of the present invention.

FIG. 2D is a cross-sectional elevational view of structure 200 taken along line 2D-2D thereof, in accordance with one or more aspects of the present invention. In the embodiment of FIG. 2D, insulating portion 230 conforms to a surface of structure 200, including electrodes 220a, 220b and link portion 210.

Those skilled in the art will note from the above description that there is a need for enhanced programmable devices, such as one-time programmable (OTP) devices, which are compatible with advanced technology nodes, such as 14 nanometer or 7 nanometer technologies, and fin-based semiconductor device technologies.

In particular, integrated circuits with advanced complementary metal oxide semiconductor devices, non-planar devices (e.g., fin field effect transistors) require a new architecture that provides added enhancements above and beyond so-called e-fuse technologies. Advantageously, the present disclosure provides, in part, technologies for use in low voltage and/or low power programming of programmable devices.

In one or more embodiments, the novel devices described herein may include metal-semiconductor systems, such as metal-Si, metal-Ge, or metal-SiGe, systems, or any other suitable systems that may be used in either front end-of line, middle of line, or back-end of line process flows. For example, the present disclosure is compatible with any stage of integrated circuit fabrication, and includes technologies that allow for on-chip silicidation mechanisms for programming of, for example, enhanced e-fuses or programmable memory devices.

In one implementation, a multiple bit element may be provided, in which each bit of the element corresponds to a different programmable device. For example, by using an appropriate matrix of sensing and programming voltage lines, individual bits may be set. In another implementation, rather than having only a single bit per programmable device, a variable resistance may be achieved by programming with a specified current for a specified duration. In such a manner, each programmable device may store 2, 4, 8, or more bits of information, depending on the achieved resolution of programming and reading the programmable device.

Advantageously, programming of the programmable devices described herein may be achieved through a process involving a metal-semiconductor system in which atoms move due to localized Joule heating, and/or silicide reaction, for instance, during operation of a completed integrated circuit. In addition, on-chip programming can allow for fine-tuning and setting of parameters by systems integrators who assemble finished products involving multiple different integrated circuits or chips because the chips can be tuned during final assembly and test.

As another advantage, the processes described herein, at least in part, allow for low-temperature fabrication. For example, because silicide processing is not necessarily required during fabrication, such processes may be used at any stage of the fabrication process without impacting prior-formed devices which are susceptible to damage from heat.

Further, those having ordinary skill in the art will understand that the low voltage, low power programming provided by these techniques can allow for a greater reliability in the programming and use of the programmable devices. In addition, such techniques may be independent of crystal defects, and may be compatible with scaling.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
   a programmable device, the programmable device comprising:
   a first electrode and a second electrode electrically connected by a link portion, the link portion consisting of one material either of a metal or a semiconductor and the first and second electrodes consisting of the other material either of the metal or the semiconductor, wherein the link portion facilitates programming the programmable device by applying a programming current between the first electrode and the second electrode to facilitate migration of the one material of the link portion towards at least one of the first or second electrodes; and
   wherein the programming current facilitates increasing an electrical resistance of the link portion of the programmable device.

2. The structure of claim 1, wherein the programming current is configured to heat the link portion to facilitate the migration of the one material of the link portion towards the at least one of the first or second electrodes.

3. The structure of claim 1, wherein the programming current facilitates a reaction of the metal and the semiconductor to form a semiconductor-metal alloy.

4. The structure of claim 1, wherein the programming current facilitates open-circuiting the programmable device.

5. The structure of claim 1, wherein the link portion comprises at least one nanowire, the at least one nanowire consisting of the one material.

6. The structure of claim 1, wherein the link portion has a certain thickness, the certain thickness of the link portion being selected to facilitate programming of the programmable device with the programming current.

7. The structure of claim 1, wherein the link portion consists of the metal and the first and second electrodes consists of the semiconductor, and the programming current facilitates migration of the semiconductor of the at least one of the first or second electrodes into the metal of the link portion.

8. The structure of claim 1, wherein the link portion consists of the metal and the first and second electrodes consists of the semiconductor, and the programming current facilitates migration of the metal of the link portion into the semiconductor of the at least one of the first or second electrodes.

9. The structure of claim 1, further comprising an insulating layer, the insulating layer being disposed above or below the link portion, wherein the insulating layer facilitates heating of the link portion by the programming current.

10. The structure of claim 9, wherein the insulating layer inhibits heating of other portions of the structure by the programming current.

11. A method comprising:
fabricating a programmable device, the fabricating comprising:
forming a first electrode and a second electrode above a substrate;
providing a link portion above the substrate and electrically connecting the first electrode and the second electrode, the link portion consisting of one material either of a metal or a semiconductor and the first and second electrodes consisting of the other material either of the metal or the semiconductor material, wherein the link portion facilitates programming the programmable device by applying a programming current between the first electrode and the second electrode to facilitate migration of the one material of the link portion towards at least one of the first or second electrodes; and
wherein the programming current facilitates increasing an electrical resistance of the link portion of the programmable device.

12. The method of claim 11, further comprising annealing the first electrode, the second electrode, and the link portion to facilitate formation of electrical junctions between the first electrode and the link portion, and the second electrode and the link portion.

13. The method of claim 11, further comprising providing an insulating layer above or below the link portion, wherein the insulating layer facilitates heating of the link portion by the programming current.

14. The method of claim 13, wherein the insulating layer inhibits heating of other portions of the structure by the programming current.

15. The method of claim 11, wherein the programming current is configured to heat the link portion to facilitate the migration of the one material of the link portion towards the at least one of the first or second electrodes.

16. The method of claim 11, wherein the programming current facilitates a reaction of the metal and the semiconductor to form a semiconductor-metal alloy.

17. The method of claim 11, wherein the programming current facilitates open-circuiting the programmable device.

18. The method of claim 11, further comprising programming the programmable device, the programming comprising applying the programming current from the first electrode through the link portion to the second electrode to migrate the one material of the link portion towards the at least one of the first or second electrodes.

* * * * *